(12) United States Patent
Tanabe et al.

(10) Patent No.: US 9,869,932 B2
(45) Date of Patent: Jan. 16, 2018

(54) CONDUCTIVE PATTERN FABRICATION METHOD

(71) Applicant: Toray Industries, Inc., Tokyo (JP)

(72) Inventors: Miharu Tanabe, Otsu (JP); Yuichiro Iguchi, Otsu (JP); Kazutaka Kusano, Otsu (JP)

(73) Assignee: Toray Industries, Inc. (JP)

( * ) Notice: Subject to any disclaimer, the term of this patent is extended or adjusted under 35 U.S.C. 154(b) by 41 days.

(21) Appl. No.: 14/432,762

(22) PCT Filed: Sep. 27, 2013

(86) PCT No.: PCT/JP2013/076291
§ 371 (c)(1),
(2) Date: Apr. 1, 2015

(87) PCT Pub. No.: WO2014/054530
PCT Pub. Date: Apr. 10, 2014

(65) Prior Publication Data
US 2015/0248058 A1     Sep. 3, 2015

(30) Foreign Application Priority Data

Oct. 4, 2012   (JP) ................................. 2012-221881

(51) Int. Cl.
G03F 7/20       (2006.01)
G06F 3/041      (2006.01)
H05K 3/12       (2006.01)
G06F 3/047      (2006.01)
G09G 5/00       (2006.01)
G03F 7/004      (2006.01)
G03F 7/028      (2006.01)

(52) U.S. Cl.
CPC .............. *G03F 7/20* (2013.01); *G03F 7/0043* (2013.01); *G03F 7/028* (2013.01); *G03F 7/2022* (2013.01); *G06F 3/041* (2013.01); *G06F 3/047* (2013.01); *G09G 5/003* (2013.01); *H05K 3/1283* (2013.01); *G06F 2203/04103* (2013.01); *G09G 2300/0404* (2013.01); *H05K 2203/1131* (2013.01)

(58) Field of Classification Search
None
See application file for complete search history.

(56) References Cited

U.S. PATENT DOCUMENTS

2005/0089794 A1* 4/2005 Fukushima ............. C03C 3/062
                                                            430/270.1
2008/0286488 A1    11/2008 Li et al.

FOREIGN PATENT DOCUMENTS

| CN | 101801674 A | 8/2010 |
|----|-------------|--------|
| JP | 06-151438   | 5/1994 |
| JP | 2011-118191 | 6/2011 |
| JP | 2011-129335 | 6/2011 |
| JP | 2012-146548 | 8/2012 |

OTHER PUBLICATIONS

The Second Office Action corresponding to Chinese Application No. 201380051742.0, dated Jun. 20, 2017, along with an English translation.

* cited by examiner

*Primary Examiner* — Duane N Taylor, Jr.
(74) *Attorney, Agent, or Firm* — DLA Piper LLP (US)

(57) ABSTRACT

A method of producing a conductive pattern includes a light-exposing step of exposing a layer or pattern including conductive particles A, an organic compound B having an unsaturated double bond and a photopolymerization initiator C, and positioned over a substrate to light rays having a broad spectrum, to thereby produce a conductive layer or a conductive pattern.

21 Claims, No Drawings

CONDUCTIVE PATTERN FABRICATION METHOD

TECHNICAL FIELD

This disclosure relates to a conductive pattern producing method.

BACKGROUND

In recent years, circuit boards and other electronic parts used in the field of touch panels, solar batteries and capacitors have been required not only to be made thinner and lighter, or be made lower in load onto the environment, but also to be exhaustively improved in yield to be improved in price competitive power.

A method of forming a conductive pattern over a circuit board is known, specifically, a conductive pattern producing method of coating a paste in which conductive particles are dispersed in a resin, drying the paste, exposing the resultant workpiece to light, developing the workpiece to form a fine pattern, and heating the workpiece to shrink the formed pattern to bring the conductive particles into contact with each other, thereby causing the pattern to express conductivity (see Publication originating from Japanese Patent Application No. 04-327423, Publication originating from Japanese Patent Application No. 2009-286095, and Publication originating from Japanese Patent Application No. 2009-276102).

However, in the conventional conductive pattern producing method, the heating treatment to bring the conductive particles into contact with each other to cause the pattern to express conductivity needs to be conducted at high temperature over a long period. When this treatment is applied to actual production, production efficiency thereof is remarkably low. Moreover, the high-temperature and long-period heating treatment may probably deteriorate the substrate or other members. In the existing circumstances, therefore, it has been required to develop a production method of yielding a fine conductive pattern while these problems are avoided.

Thus, it could be helpful to provide a conductive pattern producing method capable of yielding a conductive pattern good in conductivity, and improving the production efficiency thereof remarkably by use of light rays having a broad spectrum without conducting any heating treatment at high temperature over a long period.

SUMMARY

We thus provide:
(1) A conductive pattern producing method comprising a light-exposing step of exposing a layer or pattern comprising conductive particles A and an organic compound B and positioned over a substrate to light rays having a broad spectrum, thereby yielding a conductive layer or a conductive pattern.
(2) The conductive pattern producing method according to (1), comprising a developing step of developing the layer to yield a conductive pattern.
(3) The conductive pattern producing method according to (1) or (2), comprising a second light-exposing step of exposing the conductive pattern further to light rays having a broad spectrum.
(4) The conductive pattern producing method according to any one of (1) to (3), wherein about the former broad-spectrum-having light rays, or the former and latter broad-spectrum-having light rays, the minimum wavelength and the maximum wavelength thereof are 200 to 3000 nm.
(5) The conductive pattern producing method according to any one of (1) to (4), wherein the former broad-spectrum-having light rays, or the former and latter broad-spectrum-having light rays are light rays selected from the group consisting of light rays from a xenon lamp, light rays from a xenon flash lamp, and light rays from a halogen lamp.
(6) The conductive pattern producing method according to any one of (1) to (5), wherein in the light-exposing step, light rays having wavelengths less than 400 nm are shielded.
(7) The conductive pattern producing method according to any one of (1) to (6), wherein the conductive particles A have a volume-average particle diameter of 0.05 to 5 µm.
(8) The conductive pattern producing method according to any one of (1) to (7), wherein the conductive particles A have a volume-average particle diameter of 1 to 5 µm.
(9) The conductive pattern producing method according to any one of (1) to (8), wherein the organic compound B has an unsaturated double bond, a glycidyl group, or a carboxyl group.
(10) The conductive pattern producing method according to any one of (1) to (9), wherein the layer or pattern has an absorption band of wavelengths of 400 nm or more.
(11) The conductive pattern producing method according to any one of (1) to (10), wherein in the light-exposing step, the former broad-spectrum-having light rays are radiated in a pulse form.
(12) The conductive pattern producing method according to any one of (1) to (11), wherein the substrate is a glass substrate or a film.
(13) The conductive pattern producing method according to any one of (1) to (12), wherein a surface of the substrate is covered with a layer selected from the group consisting of a transparent conductive layer, a decorative layer, and an insulating layer.
(14) The conductive pattern producing method according to any one of (1) to (13), wherein the conductive pattern has a film thickness of 1 to 30 µm.
(15) The conductive pattern producing method according to any one of (1) to (14), wherein about the conductive pattern, the width of a line thereof is from 10 to 100 µm.
(16) The conductive pattern producing method according to any one of (1) to (15), wherein the content by percentage of one or more organic components, which include the organic compound B, in the conductive pattern is from 5 to 40% by mass.
(17) A touch sensor comprising a conductive pattern produced by the conductive pattern producing method recited in any one of (1) to (16).
(18) A touch panel comprising the touch sensor recited in (17).
(19) A display panel comprising the touch sensor recited in (18).

It is now possible to yield a conductive pattern good in conductivity, and improve the production efficiency thereof remarkably by use of light rays having a broad spectrum without conducting any heating treatment at high temperature over a long period.

DETAILED DESCRIPTION

A conductive pattern producing method according to a first configuration has a light-exposing step of exposing a layer including conductive particles A and an organic compound B to light rays having a broad spectrum to yield a conductive layer.

A conductive pattern producing method according to a second configuration has a light-exposing step of exposing a pattern including conductive particles A and an organic compound B to light rays having a broad spectrum to yield a conductive pattern.

The conductive particles A may be, for example, particles of Ag, Au, Cu, Pt, Pb, Sn, Ni, Al, W, Mo, ruthenium oxide, Cr, Ti or indium, or particles of an alloy of two or more of these metals. The conductive particles A are preferably particles of Ag, Cu or Au from the viewpoint of conductivity, and are more preferably particles of Ag from the viewpoint of low costs and stability.

The volume-average particle diameter of the conductive particles A is preferably from 0.01 to 10 μm, more preferably from 0.05 to 5 μm, even more preferably from 1 to 5 μm. When the volume-average particle diameter is 0.05 μm or more, the probability of the contact between the conductive particles A is improved so that the resultant conductive pattern is lowered in specific resistivity value and line-breaking probability. Moreover, the light rays for the light exposure are smoothly transmitted through the layer which is a dried layer to make formation of a fine pattern easy. When the volume-average particle diameter is 1 μm or more, the conductive particles easily gain a more even dispersion state to make the specific resistivity value lower. In the meantime, when the volume-average particle diameter is 5 μm or less, the resultant conductive pattern is improved in surface smoothness, pattern precision and dimension precision. The volume-average particle diameter of the conductive particles A is measurable by a dynamic light scattering method using a light scattering particle size distribution instrument (manufactured by, for example, Horiba Ltd.).

The addition amount of the conductive particles A is preferably from 70 to 95% by mass, more preferably from 80 to 90% by mass of entire solids in a conductive paste that is to be the raw material of the layer or the pattern supplied to the light-exposing step. When the amount is 70% or more by mass, in the hardening shrinkage the probability of the contact between the conductive particles A is particularly improved so that the resultant conductive pattern is lowered in specific resistivity value and line-breaking probability. When the amount is 95% or less by mass, the light rays for the light exposure are smoothly transmitted through the dried layer to make the formation of the fine pattern easy. The entire solids in the conductive paste denote all components of the conductive paste from which any organic solvent is removed.

The organic compound B is preferably a compound having an unsaturated double bond, a glycidyl group or a carboxyl group. The compound having an unsaturated double bond is preferably a photosensitive organic compound. The photosensitive organic compound is, for example, a monomer, oligomer or polymer having a polymerizable unsaturated group.

The polymerizable unsaturated group is, for example, an ethylenically unsaturated group such as a vinyl, allyl, acrylate or methacrylate group, or an acrylamide group.

Examples of the monomer having a polymerizable unsaturated group include allylated cyclohexyl diacrylate, polyethylene glycol diacrylate, dipentaerythritol hexaacrylate, dipentaerythritol monohydroxypentaacrylate, ditrimethylolpropane tetraacrylate, glycerol diacrylate, methoxylated cyclohexyl diacrylate, neopentyl glycol diacrylate, propylene glycol diacrylate, polypropylene glycol diacrylate, triglycerol diacrylate, trimethylolpropane triacrylate, bisphenol A diacrylate, ethylene oxide modified bisphenol A, diacrylate, propylene oxide modified bisphenol A diacrylate, 1,6-hexanediol diacrylate, tripropylene glycol diacrylate, 2-(2-ethoxyethoxy)ethyl acrylate, tetrahydrofurfuryl acrylate, lauryl acrylate, 2-phenoxyethyl acrylate, isodecyl acrylate, isooctyl acrylate, tridecyl acrylate, 1,3-butanediol diacrylate, 1,4-butanediol diacrylate, diethylene glycol diacrylate, tetraethylene glycol diacrylate, triethylene glycol diacrylate, bisphenol A diacrylate, and bisphenol F diacrylate; epoxy acrylates, such as a diacrylate of a bisphenol A/ethylene oxide adduct, a diacrylate of a bisphenol F/ethylene oxide adduct, and a diacrylate of a bisphenol A/propylene oxide adduct; and compounds in each of which one or more acrylic groups of any one of these compounds are partially or wholly substituted into one or more methacrylic groups.

The addition amount of the monomer having a polymerizable unsaturated group is preferably from 1 to 15% by mass, more preferably from 2 to 10% by mass of the entire solids in the conductive paste. If the amount is less than 1% by mass, the organic compound B is lowered in sensitivity to make the formation of the fine pattern difficult. If the amount is more than 15% by mass, the resultant tacky material contacts a mask for the light exposure to be contaminated, thereby causing a performance degradation or other problem.

The method of introducing the ethylenically unsaturated group into an oligomer or polymer may be, for example, a method of causing a mercapto, amino, hydroxyl or carboxyl group which the oligomer or polymer has to undergo an addition reaction with an ethylenically unsaturated compound having a glycidyl or isocyanate group, or with chloride acrylate, chloride methacrylate or allychloride in an amount of 0.05 to 1 equivalent by mole of the group of the oligomer or polymer.

Examples of the ethylenically unsaturated compound having a glycidyl group include glycidyl acrylate, glycidyl methacrylate, ally glycidyl ether, glycidyl ethylacrylate, crotonyl glycidyl ether, crotonic acid glycidyl ether, and isocrotonic acid glycidyl ether. Examples of the ethylenically unsaturated compound having an isocyanate group include (meth)acryloyl isocyanate, and (meth)acryloylethyl isocyanate.

The organic compound B preferably contains a non-photosensitive monomer, oligomer or polymer having no unsaturated double bond to bring the conductive particles A into contact with each other and improve the paste in adhesiveness onto a substrate. More preferably, the non-photosensitive monomer or the like, which has no unsaturated double bond, has a cyclic structure to cause the paste to attain a more effective light absorption. Examples of the non-photosensitive polymer, which has no unsaturated double bond, include any epoxy resin, Novolak resin, phenolic resin, polyurethane, silicone resin, melamine resin, polyimide precursor, and already-ring-closed polyimide. Examples of the epoxy resin include ethylene glycol modified epoxy resin, bisphenol A type epoxy resin, hydrogenated bisphenol A type epoxy resin, brominated epoxy resin, bisphenol F type epoxy resin, hydrogenated bisphenol F type epoxy resin, Novolak type epoxy resin, alicyclic epoxy resin, glycidylamine type epoxy resin, glycidylether type epoxy resin, and heterocyclic epoxy resin.

To photo-cure the organic compound B that is photosensitive as described above by photoreaction, a photopolymerization initiator C is preferably incorporated into the conductive paste. The photopolymerization initiator C may be, for example, a radical photopolymerization initiator or a cationic photopolymerization initiator. It is advisable to select an appropriate initiator therefrom in accordance with the light rays used in the light-exposing step.

Examples of the radical photopolymerization initiator include diethoxyacetophenone, 2-hydroxy-2-methyl-1-phenylpropane-1-one, benzyl dimethyl ketal, 1-(4-isopropylphenyl)-2-hydroxy-2-methylpropane-1-one, 4-(2-hydroxyethoxy)phenyl 2-hydroxy-2-propyl ketone, 1-hydroxycyclohexyl phenyl ketone, 1-phenyl-1,2-propanedione-2-(o-ethoxycarbonyl)oxime, 2-methyl-[4-(methylthio)phenyl]-2-morpholinopropane-1-one, 2-dimethylamino-1-(4-morpholinophenyl)-2-benzyl-butanone, benzoin, benzoin methyl ether, benzoin ethyl ether, benzoin isopropyl ether, benzoin isobutyl ether, benzophenone, methyl o-benzoylbenzoate, 4-phenylbenzophenone, 4,4-dichlorobenzophenone, hydroxybenzophenone, 4-benzoyl-4'-methyl-diphenyl sulfide, alkylated benzophenone, 3,3',4,4'-tetra(t-butylperoxycarbonyl)benzophenone, 4-benzyl-N,N-dimethyl-N-[2-(1-oxo-2-propenyloxy)ethyl] benzenemethanaminium bromide, (4-benzoylbenzyl) trimethylammonium chloride, 2-hydroxy-3-(4-benzoylphenoxy)-N,N,N-trimethyl-1-propeneaminium chloride monohydrate, 2-isopropylthioxanthone, 2,4-dimethylthioxanthone, 2,4-diethylthioxanthone, 2,4-dichlorothioxanthone, 2-hydroxy-3-(3,4-dimethyl-9-oxo-9H-thioxanthene-2-yloxy)-N,N,N-trimethyl-1-propanaminium chloride, 2,4,6-trimethylbenzoylphenylphosphine oxide, 2,2'-bis(o-chlorophenyl)-4,5,4',5'-tetraphenyl-1,2-biimidazole, 10-butyl-2-chloroacridone, 2-ethylanthraquinone, benzil, 9,10-phenanthrenequinone, camphorquinone, methylphenyl glyoxy ester, η5-cyclopentadienyl-η6-cumenyl-iron (1+)-hexafluorophosphate(1−), diphenyl sulfide derivatives, bis(η5-2,4-cyclopentadiene-1-yl)-bis(2,6-difluoro-3-(1H-pyrrole-1-yl)phenyl)thitanium, 4,4-(bis(dimethylamino) benzophenone, 4,4-bis(diethylamino)benzophenone, thioxanthone, 2-methylthioxanthone, 2-chlorothioxanthone, 4-benzoyl-4-methyl phenyl ketone, dibenzyl ketone, fluorenone, 2,3-diethoxyacetophenone, 2,2-dimethoxy-2-phenyl-2-phenylacetophenone, 2-hydroxy-2-methylpropiophenone, p-t-butyldichloroacetophenone, benzylmethoxyethylacetal, anthraquinone, 2-t-butylanthraquinone, 2-aminoanthraquinone, β-chloroanthraquinone, anthrone, benzanthrone, dibenzosuberone, methyleneanthrone, 4-azidebenzalacetophenone, 2,6-bis(p-azidebenzylidene)cyclohexane, 2,6-bis(p-azidebenzylidene)-4-methylcyclohexanone, 2-phenyl-1,2-butadione-2-(o-methoxycarbonyl)oxime, 1,3-diphenylpropanetrione-2-(o-ethoxycarbonyl)oxime, N-phenylglycine, tetrabutylammonium(+1) n-butyltriphenylborate(1−), naphthalenesulfonyl chloride, quinolinesulfonyl chloride, N-phenylthioacridone, 4,4-azobisisobutyronitrile, benzthiazole disulfide, triphenylphosphine, carbon tetrabromide, tribromophenylsulfone and benzoyl peroxide; and any combination of an optically reducible colorant such as eosin or methylene blue with a reducing agent such as ascorbic acid or triethanolamine. Other examples of the radical photopolymerization initiator include any complex of a cationic dye having an absorption band in near ultraviolet wavelengths and a borate anion, any combination of a silver halide sensitized with a near infrared colorant with a reducing agent, radical generators such as titanocene, iron arene complexes, organic peroxides, hexaaryl, biimidazole, N-phenylglycine and diaryliodonium salts; and sensitizing colorants such as 3-substituted coumalin, cyanine colorants, melocyanine colorants, thiazole colorants, and pyrylium colorants.

Examples of the cationic photopolymerization initiator include iodonium salts, sulfonium salts, phosphate salts, and antimonate salts.

The addition amount of the photopolymerization initiator C is preferably from 0.05 to 10% by mass, more preferably from 0.1 to 10% by mass of the conductive paste from the viewpoint of the optically hardening performance and compatibility thereof.

The use of a sensitizer together with the photopolymerization initiator makes it possible to improve the conductive paste in sensitivity to enlarge a wavelength range thereof that is effective for the reaction.

Specific examples of the sensitizer include 2,3-bis(4-diethylaminobenzal)cyclopentanone, 4,4-bis(dimethylamino)chalcone, p-dimethylaminocinnamylideneindanone, 2-(p-dimethylaminobiphenylvinylene)isonaphthothiazole, 1,3-bis(4-dimethylaminobenzal)acetone 3,3-carbonylbis(7-diethylaminocoumalin), triethanolamine, methyldiethanolamine, triisopropanolamine, N-phenyl-N-ethylethanolamine, N-phenylethanolamine, N-tolyldiethanolamine, methyl 4-dimethylaminobenzoate, 3-phenyl-5-benzoylthiotetrazole, and 1-phenyl-5-ethoxycarbonylthiotetrazole.

The addition amount of the sensitizer is preferably from 0.05 to 10% by mass, more preferably from 0.1 to 10% by mass of the organic compound B from the viewpoint of the optically hardening performance and compatibility thereof.

When the conductive paste contains the non-photosensitive polymer having no unsaturated double bond, it is preferred in hardening the conductive paste and the polymer that the paste contains, for example, a compound having a carboxyl group, a compound having a hydroxyl group, such as a polyhydric alcohol, a modified amine, a polyfunctional phenol, an imidazole, a mercaptan, an isocyanate, a melamine or an acid anhydride. Examples of the compound having a carboxyl group include oxalic acid, malonic acid, succinic acid, glutaric acid, adipic acid, pimelic acid, suberic acid, azelaic acid, sebacic acid, phthalic acid, isophthalic acid, and terephthalic acid. Examples of a compound corresponding to the structural formula (1) include carboxylic acids such as 2-methylmalonic acid, 2-ethylmalonic acid, 2-propylmalonic acid, 2-butylmalonic acid, 2-(3-methoxypropyl)malonic acid, 2-(3-propoxypropyl)malonic acid, 2-(3-propoxybutyl)malonic acid, (E)-2-(hexa-4-ethyl)malonic acid, 2-methylsuccinic acid, 2-ethylsuccinic acid, 2-propylsuccinic acid, 2-butylsuccinic acid, 2-(3-methoxypropyl)succinic acid, 2-(3-propoxypropyl)succinic acid, 2-(3-propoxybutyl)succinic acid, (E)-2-(hexa-4-ethyl)succinic acid, 2-methyldioic acid, 2-ethyldioic acid, 2-propyldioic acid, 2-butyldioic acid, 2-(3-methoxypropyl)dioic acid, 2-(3-propoxypropyl)dioic acid, 2-(3-propoxybutyl) dioic acid, (E)-2-(hexa-4-ethyl)dioic acid, 2-hexylpentanedioic acid, 3-hexylpentanedioic acid, 2-methylmaleic acid, 2-ethylmaleic acid, 2-propylmaleic acid, 2-butylmaleic acid, 2-(3-methoxypropyl)maleic acid, 2-(3-propoxypropyl) maleic acid, 2-(3-propoxybutyl)maleic acid and (E)-2-(hexa-4-ethyl)maleic acid. It is also allowable to use a compound obtained by causing two molecules of any one of the above-mentioned carboxylic acids to undergo dehydration condensation. Examples of the polyhydric alcohol include alkylene dihydric alcohols such as 1,2-decanediol, 1,10-decanediol, 1,2-decanediol, 1,12-dodecanediol, 1,2-dodecanediol, 1,14-tetradecanediol, 1,2-tetradecanediol, 1,16-hexadecanediol, 1,2-hexadecanediol, polyethylene glycol and polypropylene glycol, trimethyloloctane, dipentaerythritolcellulose, and tripentaerythritolcellulose.

The conductive paste preferably contains an organic solvent from the viewpoint of being adjusted in viscosity and improving the surface smoothness of the resultant coated layer. The viscosity of the conductive paste (value obtained by measuring the paste with a Brookfield viscometer at 3 rpm) is preferably from 10 to 100 Pa·s, more preferably from 10 to 50 Pa·s to prevent a coating failure or liquid dripping based on the segmentation of the conductive particles A, or improve the conductive paste in covering performance.

Examples of the organic solvent include methyl ethyl ketone, dioxane, acetone, cyclohexanone, cyclopentanone, isobutyl alcohol, isopropyl alcohol, tetrahydrofuran, γ-butyrolactone, bromobenzene, chlorobenzene, dibromobenzene, dichlorobenzene, bromobenzoic acid, chlorobenzoic acid, diethylene glycol monoethyl ether acetate, diethylene glycol monobutyl ether, diethylene glycol monobutyl ether acetate, 2-methyl-2,4-pentanediol, 3-methyl-1,5-pentanediol, 2-ethyl-1,3-hexanediol, terpineol, 3-methyl-3-methoxybutanol, texanol, benzyl alcohol, dipropylene glycol monoethyl ether, tripropylene glycol monomethyl ether, and propylene glycol monomethyl ether acetate.

An additive may be blended into the conductive paste, examples of the additive including an organic or inorganic pigment, glass powder, a filler, a plasticizer, a levelling agent such as an especial vinyl polymer or an especial acrylic polymer, a surfactant, a silane coupling agent, an antifoaming agent, and an antioxidant.

Examples of the organic pigment include carbon materials such as activated carbon, acetylene black, Ketjenblack, carbon black, titanium black, carbon whisker and carbon nanotubes, dyes, colorants, ultraviolet absorbents, visible ray absorbents, and infrared absorbents.

Examples of the ultraviolet absorbents, the visible ray absorbents or the infrared absorbents include azo dyes, aminoketone dyes, xanthene dyes, quinoline dyes, anthraquinone dyes, benzophenone dyes, triazine dyes, p-aminobenzoic acid dye cyanoacrylate compounds, salicylic acid compounds, and indole compounds. Preferred are azo dyes, benzophenone dyes, cyanoacrylate compounds, and indole compounds. Specific examples of these compounds include 2,4-dihydroxybenzophenone, 2-hydroxy-4-methoxybenzophenone, 2,2'-dihydroxy-4-methoxybenzophenone, 2,2'-dihydroxy-4,4'-dimethoxybenzophenone, 2,2'-dihydroxy-4,4'-dimethoxy-5-sulfobenzophenone, 2-hydroxy-4-methoxy-2'-carboxybenzophenone, 2-hydroxy-4-methoxy-5-sulfobenzophenone trihydrate, 2-hydroxy-4-n-octoxybenzophenone, 2-hydroxy-4-octadecyloxybenzophenone, 2,2',4,4'-tetrahydroxybenzophenone, 4-dodecyloxy-2-hydroxybenzophenone, 2-hydroxy-4-(2-hydroxy-3-methacryloxy)propoxybenzophenone, 2-ethylhexyl-2-cyano-3,3-diphenyl acrylate, 2-ethyl-2-cyano-3,3-diphenyl acrylate, and 2-(1-methyl-2-phenyl-1H-indole-3-ylmethylene)-malononitrile.

Examples of the inorganic pigment include Ru, Cr, Fe, Co, Mn, Cu, and Ni; and respective oxides of these metals. When one or more of these inorganic pigments, which are in a black powdery form, are blended into the conductive paste, the absorption and scattering of the light rays (in/on the conductive paste) can be controlled in the light-exposing step.

The glass powder or the filler preferably has a volume-average particle diameter of 0.05 to 5 μm to control the scattering of the light rays in the light-exposing step. The glass powder or the filler is more preferably one into which the following is blended: $Bi_2O_3$, $SiO_2$, $B_2O_3$, $ZrO_2$, $Al_2O_3$, $TiO_2$ or $ZnO$; or an alkali metal, an alkaline earth metal or a rare earth metal such as cerium, or an oxide of any one of these metals.

Examples of the plasticizer include dibutyl phthalate, dioctyl phthalate, polyethylene glycol, and glycerin.

Examples of the silane coupling agent include methyltrimethoxysilane, dimethyldiethoxysilane, phenyltriethoxysilane, hexamethyldisilazane, 3-methacryloxypropyltrimethoxysilane, 3-glycidoxypropyltrimethoxysilane, and vinyltrimethoxysilane.

The conductive paste can be produced by mixing necessary materials with each other, and then kneading the mixture, using, for example, a three-roll unit.

The layer or the pattern supplied to the light-exposing step can be obtained through a coating step. The coating step is a step of coating the conductive paste on/over a substrate to yield a coated layer or a coated pattern.

The substrate on/over which the conductive paste is coated is, for example, a film such as a PET film, a polyimide film, a polyester film or an aramid film; or an epoxy resin substrate, a polyetherimide resin substrate, a polyetherketone resin substrate, a polysulfone resin substrate, a glass substrate such as an alkali glass substrate, a nonalkali glass substrate or a glass/epoxy resin composite substrate, a silicon wafer, an alumina substrate, an aluminum nitride substrate, or a silicon carbide substrate. However, the substrate is preferably any film or glass substrate. The front surface of such a substrate may be covered with one or more from a transparent conductive layer, a transparent conductive pattern, a decorative layer and an insulating layer. The transparent conductive layer or pattern is, for example, a layer or pattern of ITO, which is tin-doped indium oxide, FTO, which is fluorine-doped tin oxide, copper, zinc oxide, titanium oxide, silver nano-wires, carbon nanotubes, graphene, or a conductive polymer.

The glass of the glass substrate is preferably a reinforced glass which has been subjected to reinforcing treatment. The reinforced glass is, for example, chemically reinforced glass, which is obtained by subjecting molecules of a front-surface layer of a glass piece to ion exchange to form large molecules in the glass front surface, thereby producing compressive stress in the glass front-surface layer; or physically reinforced glass, which is obtained by heating a glass piece up to a temperature at which residual stress remains therein, and then cooling the glass piece rapidly, thereby producing compressive stress in a layer of the glass front-surface.

The substrate on/over which the conductive pattern is formed may be a continuous long substrate. In the long substrate, the conductive pattern can be produced in a reel-to-reel manner or in a roll-to-roll manner. When using the roll-to-roll manner or the like, plural lines can be obtained at a time by arranging radiation light rays centrally, and further arranging substrates in parallel with each other in front and rear of the source. This manner is effective.

The method of coating the conductive paste on/over the substrate to yield the coated layer or coated pattern may be, for example, spin coating using a spinner, spray coating, roll coating, screen printing, offset printing, gravure printing, letterpress, flexography, or a method using a blade coater, a die coater, a calender coater, a meniscus coater, or a bar coater. About the thickness of the resultant coated layer or coated pattern, it is general to adjust, into the range of 1 to 20 μm, the thickness of a dried layer or dried pattern obtained by drying the coated layer or coated pattern.

The layer or pattern obtained through the coating step may be subjected to a drying step as the need arises. The drying step is a step of drying the coated layer or coated pattern yielded through the coating step to yield a dried layer or dried pattern. By the drying in the drying step, the organic solvent and others are removed from the coated layer.

The method of drying in the drying step may be heating treatment using an oven or a hot plate, the radiation of light rays such as infrared rays or drying under a reduced pressure, or a combination of two or more of these methods. The temperature for the heating treatment is preferably from 50 to 180° C., and the period for the heating treatment is preferably from 1 minute to several hours.

The coated layer yielded through the coating step may be supplied to a pre-light-exposing step as needed. The pre-light-exposing step is a step of exposing the coated layer yielded through the coating step to a light ray or light rays having a bright line to yield a light-exposed layer in which a pattern form is recorded in the conductive layer.

For the bright-line-having light ray(s), for example, a mercury lamp, which has a line spectrum in the range of ultraviolet rays, or a xenon lamp, which has a line spectrum in the range of near infrared rays, is usable. The bright line is an i-line (365 nm), an h-line (405 nm), or a g-line (436 nm), and is more preferably a line corresponding to the absorption spectrum of the organic compound or the photopolymerization initiator C.

The light-exposed layer yielded through the pre-light-exposing step may be supplied to a pre-developing step as needed. The pre-developing step is a step of developing the light-exposed layer yielded through the pre-light-exposing step to yield a pattern. By the development, specifically, by using a developing solution to remove the non-light-exposed portion(s), the pattern form recorded in the light-exposed layer is made naked to form a desired pattern. The development may be, for example, alkaline development, in which an alkaline developing solution is used, or organic development, in which an organic solvent is used, and is preferably alkaline development. The alkaline development solution is, for example, an aqueous solution of tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, or hexamethylenediamine. For example, the following may be added to such an aqueous solution: a polar solvent such as N-methyl-2-pyrrolidone, N,N-dimethylforamide, N,N-dimethylacetoamide, dimethylsulfoxide or γ-butyrolactone, an alcohol such as methanol, ethanol or isopropanol, an ester such as ethyl lactate or propylene glycol monomethyl ether acetate, a ketone such as cyclopentanone, cyclohexanone, isobutyl ketone or methyl isobutyl ketone, or a surfactant.

The development can be performed by, for example, a method of showering the light-exposed layer with the developing solution while the substrate is allowed to stand still or rotated, or of immersing the substrate with the light-exposed layer into the developing solution.

After the development, the resultant pattern may be subjected to rinsing treatment with a rinsing liquid. The rinsing liquid may be, for example, water, or a solution in which an alcohol such as ethanol or isopropyl alcohol, or an ester, such as ethyl lactate or propylene glycol monomethyl ether acetate, is added to water.

The light-exposing step is a step of exposing, to light rays, the layer or pattern yielded through the coating step, the pre-light-exposing step, the pre-developing step or the drying step to yield a conductive layer or conductive pattern. When the organic compound B included in the layer or pattern contains, for example, a photosensitive organic compound, the light exposure in the light-exposing step and the presence of the photopolymerization initiator C cause the photosensitive organic compound to undergo a photoreaction so that the layer or pattern is shrunken. Thus, the conductive particles A are brought into contact with each other so that the layer or the pattern expresses conductivity. To heighten the effect of shrinking the layer or pattern, thermal treatment may be conducted before or after the light exposure, or simultaneously with the light exposure. The method of this thermal treatment is, for example, heating using an oven, an inert oven or a hot plate, or the radiation of infrared rays. A pattern form can be recorded into the layer by shielding the light rays for the light exposure in a desired pattern form through a light-exposing mask. To radiate heat generated by the absorption of the light rays into the substrate, the light-exposing step may be performed while the substrate is cooled.

The light rays for the light exposure in the light-exposing step need to be light rays having a broad spectrum so that the layer or pattern can gain a preferred conductivity. The minimum wavelength and the maximum wavelength thereof are each preferably 200 to 3000 nm. The minimum wavelength and the maximum wavelength thereof are each more preferably 400 to 1500 nm. The range of extra wavelengths of the broad-spectrum-having light rays may be shielded through an optical filter, a prism or some other. When the substrate sufficiently absorbs, for example, light rays having wavelengths of less than 400 nm, it is preferred to shield the light rays, which have wavelengths of less than 400 nm to prevent a deterioration of the substrate, or the decorative layer, the insulating layer, the ITO thin layer or some other layer on the front surface of the substrate.

A light source for the broad-spectrum-having light rays is, for example, a xenon lamp, a halogen lamp, a deuterium lamp, an LED, a laser, plasma, a light emitting diode, a light bulb, or a light source in which a kanthal line, tungsten, carbon or some other is used as or for a filament. Preferred is a xenon lamp or halogen lamp, which emits light rays containing near infrared rays, and more preferred is a xenon lamp. The xenon lamp referred to herein denotes a lamp making use of light emission based on electric discharge in a rare gas such as xenon, neon, argon, helium or krypton.

It is preferred to radiate light rays from the xenon lamp in a pulse form. Such a wording "radiation in a pulse form or pulse-form radiation" as referred to herein denotes the manner of radiating light while continuous radiation and intermittent radiation are instantaneously repeated, that is, radiating light periodically. Conditions for repeating the continuous radiation and the intermittent radiation, and the period for radiating the light rays in the pulse-form radiation, that is, pulse-form radiation conditions are controllable in accordance with the frequency, which is the number of repeated pulses per second. The energy amount of the radiated light rays is controllable in accordance with the width of the pulses, and the number of the pulses. The pulse-form radiation makes it possible to radiate strong or weak light rays more instantaneously than simple continuous radiation to be favorable in preventing a rapid change in the property of the conductive pattern or the substrate. It is sufficient for the period for the pulse-form radiation, and the number thereof to be appropriately selected in accordance with the composition of the conductive pattern, or the species of the substrate. The pulse-form radiation is a favorable manner for the purpose of, for example, an improvement in production efficiency, and prevention of an extra light scattering and a deterioration/damage of the substrate. The period for the pulse-form radiation is more specifically as follows: in the case of using a xenon flash lamp to attain the light exposure, the total pulse-form radiation period is preferably from 0.03 to 100 msec. If the total pulse-form radiation period is more than 100 msec, the film substrate may be strained. If the period is less than 0.05 msec, the resultant conductive layer or conductive pattern becomes insufficient in conductivity.

In a halogen lamp, it is preferred to set the total pulse-form radiation period to 1 to 60 sec and combine the pulse-form radiation therewith.

In a light source different from any xenon lamp or halogen lamp and can radiate light rays including near infrared rays, the total pulse-form radiation period is preferably 5 minutes or shorter. If the radiation period is too long, the substrate is remarkably deteriorated.

Together with the broad-spectrum-having light rays, one or more light rays having a bright line may be radiated. To radiate the broad-spectrum-having light rays and the bright-line-having light ray(s) simultaneously, for example, a mercury xenon lamp may be used, or light rays from a xenon lamp and a mercury lamp may be simultaneously radiated. In this case, the pre-light-exposing step and the light-exposing step can be simultaneously performed.

The light rays for the light exposure in the light-exposing step may be radiated from either the front surface or the rear surface of the substrate. By radiating the light rays for the light exposure simultaneously onto the front and rear surfaces, the radiated light rays are more delicately controllable so that it is expectable to improve the production efficiency and improve the adhesiveness between the substrate and the conductive pattern. Light rays for the light exposure for the front surface may be equal to or different from ones for the rear surface.

In attaining the drying in the above-mentioned drying step by the radiation of light rays, the drying step and the light-exposing step can be performed at a time when the light rays for the drying are consistent with those for the light-exposing step.

The developing step in the first configuration is a step of developing the conductive layer yielded through the light-exposing step to yield a conductive pattern. In the conductive pattern producing method according to the second configuration, a desired pattern has been already formed in the coating step, or the pre-light-exposing step and the pre-developing step so that a conductive pattern is gained when the light-exposing step is finished. Thus, no developing step is required.

By the development, the conductive pattern form recorded in the conductive layer is made naked to form a desired conductive pattern. In the same manner as in the pre-developing step, the development is preferably alkaline development.

In the same manner as in the pre-developing step, the development can be performed by, for example, a method of showering the light-exposed layer with the developing solution while the substrate is allowed to stand still or rotated, or of immersing the substrate with the light-exposed layer into the developing solution.

In the same manner as in the pre-developing step, after the development, the resultant pattern may be subjected to rinsing treatment with a rinsing liquid.

When the conductivity of the resultant conductive paste is insufficient, a second light-exposing step may be performed in which the conductive pattern is further exposed to light rays having a broad spectrum. More specifically, for example, the conductive paste is exposed to light rays having a bright line and developed to form a fine conductive pattern, and further in a second light-exposing step, the conductive pattern is exposed to light rays having a broad spectrum. In this way, a fine conductive pattern high in conductivity can be yielded.

The conductive pattern produced by the producing method preferably contacts the transparent conductive layer or pattern on/over the front surface of the substrate to be electrically connected to each other. The transparent conductive layer or pattern on/over the front surface of the substrate may further contact the decorative layer, the insulating layer, a layer for the light shielding, or some other member. The decorative layer denotes a resin layer formed by mixing a white or black pigment, a hardener and an additive with a resin. The front surface of the decorative layer may be covered with a thin layer of a metal such as Mo, Ni, Al or Nd. It is sufficient for the insulating layer to be formed at moieties for which electrical insulation from the conductive pattern is required. The insulating layer is, for example, a resin layer formed by mixing fine powder of silica, titania or some other with an acrylic resin, a siloxane resin, or the two resins.

A touch panel produced using the conductive pattern yielded by the producing method is composed of an insulating layer, a protecting layer or transparent conductive layer, and/or some other that cover(s) a part or the whole of the decorative layer and/or the light shielding layer formed on/over the substrate. The conductive pattern contacts a part or the whole of the light shielding layer, the insulating layer, the protecting layer or the transparent conductive layer, and functions, in particular, as a leader wiring line from the touch panel.

EXAMPLES

Hereinafter, our methods will be described in more detail by way of working examples and comparative examples.
Conductive paste materials:

Conductive particles (A-1): Ag powder produced by a wet reducing method (volume-average particle diameter: 1.19 μm, specific surface area: 1.12 m$^2$/g, and tap density: 4.8 g/cm$^3$).

Conductive particles (A-2): Ag powder produced by a wet reducing method (volume-average particle diameter: 0.4 μm, specific surface area: 2.50 m$^2$/g, and tap density: 3.1 g/cm$^3$).

Conductive particles (A-3): Ag powder produced by a wet reducing method (volume-average particle diameter: 3.65 μm, specific surface area: 0.17 m$^2$/g, and tap density: 6.2 g/cm$^3$).

Conductive particles (A-4): Ag powder produced by a wet reducing method (volume-average particle diameter: 6.1 μm, specific surface area: 0.17 m$^2$/g, and tap density: 4.2 g/cm$^3$).

Organic compound (B-1): a substance obtained by heating and melting 60 g of a binder polymer (TR-2500, manufactured by Negami Chemical Industrial Co., Ltd.) and 100 g of diethylene glycol monobutyl ether acetate at 60° C.

Organic compound (B-2): a photosensitive acrylic polymer (APX-716, manufactured by Toray Industries. Inc.) having an acid value of 85 and a weight-average molecular weight of 32,000.

Organic compound (B-3): a substance obtained by causing a copolymer of an ethylene oxide modified bisphenol A diacrylate (FA-324A, manufactured by Hitachi Chemical Co., Ltd.)/EA/AA (copolymerization ratio: 50 parts by mass/10 parts by mass/15 parts by mass) to undergo an addition reaction with 5 parts by mass of glycidyl methacrylate (GMA); more specifically, an organic compound obtained by the following: initially, 150 g of diethylene glycol monoethyl ether acetate was charged into a reactor having an atmosphere of nitrogen, and then an oil bath was used to raise the temperature of the system to 80° C.; thereto was dropwise added a mixture of 50 g of ethylene oxide modified bisphenol A diacrylate (FA-324A), 20 g of ethyl acrylate, 15 g of acrylic acid, 0.8 g of 2,2'-azobisisobutyronitrile, and 10 g of diethylene glycol monoethyl ether acetate over 1 hour, and further the polymerization reaction was conducted for 6 hours; thereafter, thereto was added 1 g of hydroquinone monomethyl ether to stop the polymerization reaction; thereto was dropwise added a mixture of 5 g of glycidyl methacrylate, 1 g of triethylbenzylammonium chloride, and 10 g of diethylene glycol monoethyl acetate over 0.5 hour, and further the addition reaction was conducted for 2 hours; and lastly, the resultant reaction solution was purified with methanol to remove unreacted impurities, and further the remaining product was vacuum-dried for 24 hours.

Organic compound (B-4): isooctyl acrylate.

Organic compound (B-5): dipentaerythritol hexaacrylate.

Organic compound (B-6): dipentaerythritol monohydroxypentaacrylate.

Photopolymerization initiator (C-1): 1-hydroxycyclohexyl phenyl ketone.

Photopolymerization initiator (C-2): 2-dimethylamino-1-(4-morpholinophenyl)-2-benzyl-1-butanone.

Production of a conductive paste X:

To 100 g of the organic compound (B-1), 5 g of the organic compound (B-4) and 25 g of the organic compound (B-5) were added 0.1 g of 1,6-hexanediol bis[(3,5-di-t-butyl-4-hydroxyphenyl)propionate], 5 g of the photopolymerization initiator (C-1) and 2 g of a dispersing agent (FLOWLEN G-700DMEA, manufactured by Kyoeisha Chemical Co., Ltd.). This reaction system was stirred for 2 hours to yield a photosensitive resin solution X. The photosensitive resin solution, the amount of which was 120 g, was mixed with 380 g of the conductive particles (A-1). A three-roll unit (EXAKT M-50, manufactured by a company, Exakt) was used to knead the mixture to yield a conductive paste X.

Production of a conductive paste Y:

To 25 g of the organic compound (B-2) and 10 g of the organic compound (B-6) were added 2.5 g of the photopolymerization initiator (C-2), 2 g of benzoin isopropyl ether, 0.05 g of 1,6-hexanediol bis[(3,5-di-t-butyl-4-hydroxyphenyl)propionate], and 30 g of 3-methoxy-3-methylbutanol. This reaction system was stirred for 2 hours to yield a photosensitive resin solution Y. The resultant photosensitive resin solution Y was mixed with 80 g of the conductive particles (A-1), and a three-roll unit was used to knead the mixture. In this way, a conductive paste Y was yielded.

Production of a conductive paste Z:

To 17.5 g of the organic compound (B-3) were added 3.5 g of the photopolymerization initiator (C-2) and 17.0 g of diethylene glycol monobutyl ether. This reaction system was stirred for 2 hours to yield a photosensitive resin solution Z. The resultant photosensitive resin solution Z was mixed with 140.5 g of the conductive particles (A-1), and a three-roll unit was used to knead the mixture. In this way, a conductive paste Z was yielded.

Production of a conductive paste P:

The photosensitive resin solution Z yielded by the same method as described above was mixed with 140.5 g of the conductive particles (A-2), and a three-roll unit was used to knead the mixture. In this way, a conductive paste P was yielded.

Production of a conductive paste Q:

The photosensitive resin solution Z yielded by the same method as described above was mixed with 140.5 g of the conductive particles (A-3), and a three-roll unit was used to knead the mixture. In this way, a conductive paste Q was yielded.

Production of a conductive paste R:

The photosensitive resin solution Z yielded by the same method as described above was mixed with 140.5 g of the conductive particles (A-4), and a three-roll unit was used to knead the mixture. In this way, a conductive paste R was yielded.

Example 1

The conductive paste X was coated onto a glass substrate by screen printing to produce a coated layer.

The resultant coated layer was thermally treated in an air-passing oven of 100° C. temperature for 1 hour to be dried. In this way, a dried layer was produced.

The resultant dried layer was exposed through a light-exposing mask to light rays from a light-exposing machine (LA3000F, manufactured by Dainippon Screen Mfg. Co., Ltd.) having a xenon flash lamp by the pulse-form radiation thereof (applied voltage: 3200 V; and radiation period: 0.6 msec). In this way, a conductive layer was produced.

The resultant conductive layer was showered with a 0.3%-by-mass solution of sodium carbonate in water, the temperature of which was 30° C., for 30 seconds, and then rinsed with water to remove the non-exposed portions. In this way, a conductive pattern in a stripe form was produced.

About the resultant conductive pattern, the film thickness was 6 μm, and the line width and the space width were 50 μm and 50 μm, respectively. The conductive pattern had neither residues nor exfoliation to be a good fine wiring line. About a sample therefrom that had a line width of 50 μm and a line length of 45 mm, a resistivity meter (LORESTA (registered trade name) GP, manufactured by Mitsubishi Chemical Corp.) was used to measure the line resistance thereof. As a result, the resistance was 105Ω. The substrate was not strained, changed in color, nor damaged into other forms to be good in quality.

Example 2

The conductive paste X was coated into a stripe form onto a glass substrate by screen printing to produce a stripe-form coated pattern.

The resultant stripe-form coated pattern was thermally treated in an air-passing oven of 100° C. temperature for 1 hour to be dried. In this way, a stripe-form dried pattern was produced.

The resultant stripe-form dried pattern was exposed to light rays from the light-exposing machine having the xenon flash lamp by the pulse-form radiation thereof (applied voltage: 3200 V; and radiation period: 0.8 msec). In this way, a stripe-form conductive pattern was produced.

About the resultant conductive pattern, the film thickness was 6 μm, and the line width and the space width were 50 μm and 50 μm, respectively. The conductive pattern had neither residues nor exfoliation to be a good fine wiring line. About a sample therefrom that had a line width of 50 μm and a line length of 45 mm, the line resistance was 95Ω. The substrate was not strained, changed in color, nor damaged into other forms to be good in quality.

Example 3

The conductive paste Y was coated onto a glass substrate by screen printing to produce a coated layer.

The resultant coated layer was thermally treated in an air-passing oven of 100° C. temperature for 1 hour to be dried. In this way, a dried layer was produced.

The resultant dried layer was exposed through a light-exposing mask to light rays from a light-exposing machine (PEM-6M, manufactured by Union Optical Co., Ltd.) having a mercury lamp by the radiation thereof at an exposure of 200 mJ/cm$^2$ (in terms of a light ray of a wavelength of 365 nm). In this way, a light-exposed layer was produced.

The resultant light-exposed layer was developed in the same way as in Example 1, and then rinsed with water to remove the non-exposed portions. In this way, a conductive pattern in a stripe form was produced.

The resultant conductive pattern was further exposed to light rays from a light-exposing machine (LA3000F, manufactured by Dainippon Screen Mfg. Co., Ltd.) having a xenon flash lamp by the pulse-form radiation thereof.

About the finally produced conductive pattern, the film thickness was 6 μm, and the line width and the space width were 20 μm and 20 μm, respectively. The conductive pattern had neither residues nor exfoliation to be a good fine wiring line. About a sample therefrom that had a line width of 50 μm and a line length of 45 mm, the line resistance was 90Ω. The substrate was not strained, changed in color, nor damaged into other forms to be good in quality.

Example 4

The same operations as in Example 3 were made except that the conductive paste Z was used instead of the conductive paste Y to produce a stripe-form conductive pattern. About the finally produced conductive pattern, the film thickness was 6 μm, and the line width and the space width were 20 μm and 20 μm, respectively. The conductive pattern had neither residues nor exfoliation to be a good fine wiring line. About a sample therefrom that had a line width of 50 μm and a line length of 45 mm, the line resistance was 95Ω. The substrate was not strained, changed in color, nor damaged into other forms to be good in quality.

Example 5

The same operations as in Example 3 were made except that the conductive paste P was used instead of the conductive paste Y to produce a stripe-form conductive pattern. About the finally produced conductive pattern, the film thickness was 6 μm, and the line width and the space width were 20 μm and 20 μm, respectively. The conductive pattern had neither residues nor exfoliation to be a good fine wiring line. About a sample therefrom that had a line width of 50 μm and a line length of 45 mm, the line resistance was 130Ω. The substrate was not strained, changed in color, nor damaged into other forms to be good in quality.

Example 6

The same operations as in Example 3 were made except that the conductive paste Q was used instead of the conductive paste Y to produce a stripe-form conductive pattern. About the finally produced conductive pattern, the film thickness was 6 μm, and the line width and the space width were 20 μm and 20 μm, respectively. The conductive pattern had neither residues nor exfoliation to be a good fine wiring line. About a sample therefrom that had a line width of 50 μm and a line length of 45 mm, the line resistance was 80Ω. The substrate was not strained, changed in color, nor damaged into other forms to be good in quality.

Example 7

The same operations as in Example 3 were made except that the conductive paste R was used instead of the conductive paste Y to produce a stripe-form conductive pattern. About the finally produced conductive pattern, the film thickness was 6 μm, and the line width and the space width were 25 μm and 15 μm, respectively. Thus, the line width was slightly larger than the target line width, which was 20 μm. About a sample therefrom that had a line width of 50 μm and a line length of 45 mm, the line resistance was 170Ω. The substrate was not strained, changed in color, nor damaged into other forms to be good in quality.

Example 8

The same operations as in Example 3 were made except that a PET film substrate was used instead of the glass substrate, and further a cut filter for cutting a light wavelength of 400 nm was used and fitted to the light source to produce a conductive pattern.

About the finally produced conductive pattern, the film thickness was 6 μm, and the line width and the space width were 20 μm and 20 μm, respectively. The conductive pattern had neither residues nor exfoliation to be a good fine wiring line. About a sample therefrom that had a line width of 50 μm and a line length of 45 mm, the line resistance was 70Ω. The substrate was not strained, changed in color, nor damaged into other forms to be good in quality.

Example 9

The same operations as in Example 3 were made except that a PET film substrate was used instead of the glass substrate to produce a light-exposed layer. The resultant light-exposed layer was developed in the same way as used for the conductive layer in Example 1, and then rinsed with water to remove the non-exposed portions. In this way, a conductive pattern in a stripe form was produced.

The resultant conductive pattern was exposed to light rays from a light-exposing machine (manufactured by Heraeus K.K.) having a xenon flash lamp by the pulse-form radiation thereof (applied voltage: 400 V; and radiation period: 0.2 msec).

About the finally produced conductive pattern, the film thickness was 6 μm, and the line width and the space width were 20 μm and 20 μm, respectively. The conductive pattern had neither residues nor exfoliation to be a good fine wiring line. About a sample therefrom that had a line width of 50 μm and a line length of 45 mm, the line resistance was 130Ω. The substrate was not strained, changed in color, nor damaged into other forms to be good in quality.

Example 10

The same operations as in Example 3 were made to produce a light-exposed layer. The resultant light-exposed layer was developed in the same way as used for the conductive layer in Example 1, and then rinsed with water to remove the non-exposed portions. In this way, a conductive pattern in a stripe form was produced.

The resultant conductive pattern was further exposed to light rays from a short-wavelength infrared generator (manufactured by Heraeus K.K.; maximum energy wavelength: 1.2 μm) by the radiation thereof (energy density: 20 kW/m², and radiation period: 5 minutes).

About the finally produced conductive pattern, the film thickness was 6 gm, and the line width and the space width were 20 μm and 20 μm, respectively. The conductive pattern had neither residues nor exfoliation to be a good fine wiring line. About a sample therefrom that had a line width of 50 μm and a line length of 45 mm, the line resistance was 80Ω. The substrate was not strained, changed in color, nor damaged into other forms to be good in quality.

Example 11

The same operations as in Example 3 were made to produce a light-exposed layer. The resultant light-exposed layer was developed in the same way as used for the conductive layer in Example 1, and then rinsed with water to remove the non-exposed portions. In this way, a conductive pattern in a stripe form was produced.

The resultant conductive pattern was further exposed to light rays from a short/middle-wavelength infrared generator (of a carbon type, manufactured by Heraeus K.K.; maximum energy wavelength: 2.0 μm) by the radiation thereof (energy density: 20 kW/m²; and radiation period: 3 minutes).

About the finally produced conductive pattern, the film thickness was 6 μm, and the line width and the space width were 20 μm and 20 μm, respectively. The conductive pattern had neither residues nor exfoliation to be a good fine wiring line. About a sample therefrom that had a line width of 50 μm and a line length of 45 mm, the line resistance was 80Ω. The substrate was not strained, changed in color, nor damaged into other forms to be good in quality.

Example 12

The same operations as in Example 3 were made to produce a light-exposed layer. The resultant light-exposed layer was developed in the same way as used for the conductive layer in Example 1, and then rinsed with water to remove the non-exposed portions. In this way, a conductive pattern in a stripe form was produced.

The resultant conductive pattern was further exposed to light rays from a middle-wavelength infrared generator (manufactured by Heraeus K.K.; maximum energy wavelength: 2.6 μm) by the radiation thereof (energy density: 25 kW/m²; and radiation period: 2 minutes).

About the finally produced conductive pattern, the film thickness was 6 μm, and the line width and the space width were 20 μm and 20 μm, respectively. The conductive pattern had neither residues nor exfoliation to be a good fine wiring line. About a sample therefrom that had a line width of 50 μm and a line length of 45 mm, the line resistance was 80Ω. The substrate was not strained, changed in color, nor damaged into other forms to be good in quality.

Example 13

The same operations as in Example 3 were made except that a PET film substrate was used instead of the glass substrate to produce a light-exposed layer. The resultant light-exposed layer was developed in the same way as used for the conductive layer in Example 1, and then rinsed with water to remove the non-exposed portions. In this way, a conductive pattern in a stripe form was produced.

The resultant conductive pattern was further exposed to light rays from the middle-wavelength infrared generator by the radiation thereof (energy density: 25 kW/m²; and radiation period: 1 minute).

About the finally produced conductive pattern, the film thickness was 6 μm, and the line width and the space width were 20 μm and 20 μm, respectively. The conductive pattern had neither residues nor exfoliation to be a good fine wiring line. About a sample therefrom that had a line width of 50 μm and a line length of 45 mm, the line resistance was 50Ω. The substrate was not strained, changed in color, nor damaged into other forms to be good in quality.

Comparative Example 1

The conductive paste X was coated into a stripe form onto a glass substrate by screen printing to produce a stripe-form coated layer.

The resultant stripe-form coated layer was thermally treated in an air-passing oven of 100° C. temperature for 1 hour to be dried. In this way, a stripe-form dried layer was produced.

The resultant stripe-form dried layer was thermally treated in an air-passing oven of 140° C. temperature for 10 minutes to produce a stripe-form conductive pattern.

About the resultant conductive pattern, the film thickness was 6 μm, and the line width and the space width were 50 μm and 50 μm, respectively. The conductive pattern was a good fine wiring line. About a sample therefrom that had a line width of 50 μm and a line length of 45 mm, the line resistance was 500Ω or more to be a high resistance value. Thus, the conductive pattern was impracticable.

Comparative Example 2

The same operations as in Comparative Example 1 were made except that the period for the thermal treatment of the stripe-form dried pattern was changed to 30 minutes to produce a stripe-form conductive pattern. About the resultant stripe-from conductive pattern, the film thickness was 6 μm, and the line width and the space width were 50 μm and 50 μm, respectively. The conductive pattern had neither residues nor exfoliation to be a good fine wiring line. About a sample therefrom that had a line width of 50 μm and a line length of 45 mm, the line resistance was 200Ω to be a high resistance value. Thus, the conductive pattern was impracticable.

Comparative Example 3

The same operations as in Comparative Example 1 were made except that a PET film substrate was used instead of the glass substrate, and the period for the thermal treatment of the stripe-form dried pattern was changed to 1 hour to produce a stripe-form conductive pattern. About the resultant stripe-from conductive pattern, the film thickness was 6 μm, and the line width and the space width were 50 μm and 50 μm, respectively. The conductive pattern had neither residues nor exfoliation. However, it was observed that the substrate was partially strained, and had spots appearing to be based on the generation of air bubbles. Thus, the conductive pattern was impracticable.

INDUSTRIAL APPLICABILITY

We provide a method of producing a conductive pattern for a circuit board of a touch panel or for others.

The invention claimed is:

1. A method of producing a conductive pattern comprising:
   a light-exposing step of exposing selected portions of a layer or pattern comprising conductive particles A, an organic compound B having a polymerizable unsaturated double bond and a photopolymerization initiator C, and positioned over a substrate to light rays,
   followed directly by a development step of contacting at least a selected portion of the layer or the pattern with an alkaline developer solution to remove unexposed portions of the layer,
   followed directly, but optionally, by a rinsing step of rinsing the layer or pattern, and
   followed directly by a second light-exposing step of exposing remaining portions of the layer or the pattern to light having a broad spectrum and wavelengths less than 400 nm being shielded to thereby produce a conductive layer or a conductive pattern.

2. The method according to claim 1, wherein the light rays are selected from the group consisting of light rays from a xenon lamp, light rays from a xenon flash lamp, and light rays from a halogen lamp.

3. The method according to claim 1, wherein the conductive particles A have a volume-average particle diameter of 0.05 to 5 μm.

4. The method according to claim 1, wherein the conductive particles A have a volume-average particle diameter of 1 to 5 μm.

5. The method according to claim 1, wherein the organic compound B has a glycidyl group or a carboxyl group.

6. The method according to claim 1, wherein the layer or pattern has an absorption band of wavelengths of 400 nm or more.

7. The method according to claim 1, wherein the substrate is a glass substrate or a film.

8. The method according to claim 1, wherein a surface of the substrate is covered with a layer selected from the group consisting of a transparent conductive layer, a decorative layer, and an insulating layer.

9. The method according to claim 1, wherein the conductive pattern has a film thickness of 1 to 30 μm.

10. The method according to claim 1, wherein about the conductive pattern, a width of a line thereof is 10 to 100 μm.

11. The method according to claim 1, wherein the content by percentage of one or more organic components, which include the organic compound B, in the conductive pattern is from 5 to 40% by mass.

12. A touch sensor comprising a conductive pattern produced by the method recited in claim 1.

13. A touch panel comprising the touch sensor recited in claim 12.

14. A display panel comprising the touch sensor recited in claim 12.

15. The method according to claim 1, wherein the conductive particles are selected from the group consisting of Ag, Au, Cu, Pt, Pb, Sn, Ni, Al, W, Mo, ruthenium oxide, Cr, Ti or indium, or particles of an alloy or of two or more of such metals.

16. The method according to claim 1, wherein the content of the organic compound B is 1 to 15% by mass of the entire solid in the layer or the pattern.

17. A method of producing a conductive pattern comprising:
   a light-exposing step of exposing selected portions of a layer or pattern comprising conductive particles A, an organic compound B having a polymerizable unsaturated double bond and a photopolymerization initiator C, and positioned over a substrate to light rays having a broad spectrum, wherein in the light-exposing step, light rays having wavelengths less than 400 nm are shielded,
   followed directly by a development step of contacting at least a selected portion layer with an alkaline developer solution to remove unexposed portions of the layer or the pattern, to thereby produce a conductive layer or a conductive pattern, and
   optionally, followed directly by a rinsing step of rinsing the layer or pattern.

18. The method according to claim 17, wherein minimum wavelength and maximum wavelength of the broad spectrum light rays are 200 to 3000 nm.

19. The method according to claim 17, wherein in the light-exposing step, the broad spectrum light rays are radiated in a pulse form.

20. The method according to claim 17, wherein the conductive particles are selected from the group consisting of Ag, Au, Cu, Pt, Pb, Sn, Ni, Al, W, Mo, ruthenium oxide, Cr, Ti or indium, or particles of an alloy or of two or more of such metals.

21. The method according to claim 17, wherein the content of the organic compound B is 1 to 15% by mass of the entire solid in the layer or the pattern.

* * * * *